United States Patent
Valdes et al.

(10) Patent No.: US 9,697,992 B2
(45) Date of Patent: Jul. 4, 2017

(54) SYSTEM AND APPARATUS FOR ARC ELIMINATION

(71) Applicant: General Electric Company, Schenectady, NY (US)

(72) Inventors: Marcelo Esteban Valdes, Burlington, CT (US); Thangavelu Asokan, Bangalore Karnataka (IN)

(73) Assignee: GENERAL ELECTRIC COMPANY, Schenectady, NY (US)

(*) Notice: Subject to any disclaimer, the term of this patent is extended or adjusted under 35 U.S.C. 154(b) by 249 days.

(21) Appl. No.: 14/183,653

(22) Filed: Feb. 19, 2014

(65) Prior Publication Data

US 2014/0239812 A1    Aug. 28, 2014

(30) Foreign Application Priority Data

Feb. 22, 2013    (IN) ............................. 790/CHE/2013

(51) Int. Cl.
*H05H 1/52*    (2006.01)
*H01J 37/32*    (2006.01)

(52) U.S. Cl.
CPC ......... *H01J 37/32532* (2013.01); *H05H 1/52* (2013.01)

(58) Field of Classification Search
None
See application file for complete search history.

(56) References Cited

U.S. PATENT DOCUMENTS

| | | | |
|---|---|---|---|
| 2,474,711 A | 6/1949 | Yonkers et al. | |
| 3,848,288 A | 11/1974 | Richards et al. | |
| 4,341,947 A * | 7/1982 | Komura | F24H 1/101 174/15.3 |
| 4,548,033 A * | 10/1985 | Cann | B64G 1/406 313/231.41 |
| 4,577,461 A * | 3/1986 | Cann | B64G 1/406 219/121.49 |
| 4,668,853 A * | 5/1987 | Fey | H05H 1/28 219/121.49 |
| 4,967,055 A * | 10/1990 | Raney | H05H 1/3405 219/121.48 |

(Continued)

FOREIGN PATENT DOCUMENTS

| | | |
|---|---|---|
| CN | 101277008 A | 10/2008 |
| CN | 102047548 A | 5/2011 |

(Continued)

OTHER PUBLICATIONS

Thangavelu Asokan et al., U.S. Appl. No. 13/752,671, filed Jan. 29, 2013.

(Continued)

*Primary Examiner* — Douglas W Owens
*Assistant Examiner* — Srinivas Sathiraju
(74) *Attorney, Agent, or Firm* — GE Global Patent Operation; Stephen G. Midgley

(57) ABSTRACT

An apparatus is provided. The apparatus includes a plasma generation element physically coupled to a first main electrode. The plasma generation element includes at least a first open end and a second open end. Each open end defines a nozzle such that the first open end directs an ablative plasma to a second main electrode and the second open end directs the ablative plasma to a third main electrode.

20 Claims, 6 Drawing Sheets

(56) References Cited

U.S. PATENT DOCUMENTS

| | | | |
|---|---|---|---|
| 5,131,992 A * | 7/1992 | Church | H01J 37/32192 204/164 |
| 5,584,974 A * | 12/1996 | Sellers | H01J 37/3444 204/192.12 |
| 5,801,489 A | 9/1998 | Chism et al. | |
| 6,236,546 B1 | 5/2001 | Blickhan et al. | |
| 7,821,749 B2 | 10/2010 | Asokan et al. | |
| 7,929,260 B2 | 4/2011 | Roscoe et al. | |
| 8,264,809 B2 | 9/2012 | Robarge et al. | |
| 8,270,139 B2 | 9/2012 | Caggiano et al. | |
| 8,506,771 B2 | 8/2013 | Horishita et al. | |
| 8,618,435 B2 * | 12/2013 | Bohori | B23K 9/013 219/121.36 |
| 8,742,282 B2 * | 6/2014 | Asokan | H05H 1/52 219/121.36 |
| 8,861,144 B2 * | 10/2014 | Shea | H01T 2/02 361/117 |
| 9,036,309 B2 * | 5/2015 | Roscoe | H01T 2/02 361/2 |
| 2003/0058596 A1 | 3/2003 | MacBeth | |
| 2003/0205327 A1 * | 11/2003 | Howald | H01J 37/32623 156/345.28 |
| 2005/0152078 A1 | 7/2005 | Shea et al. | |
| 2007/0113867 A1 * | 5/2007 | Duan | B08B 7/0035 134/1.1 |
| 2008/0152923 A1 | 6/2008 | Sugawara | |
| 2008/0170344 A1 | 7/2008 | Byron | |
| 2008/0303615 A1 | 12/2008 | Hardesty et al. | |
| 2009/0134129 A1 | 5/2009 | Robarge et al. | |
| 2009/0308845 A1 * | 12/2009 | Bohori | H01T 1/00 218/157 |
| 2010/0052761 A1 * | 3/2010 | Roscoe | H01T 2/02 327/294 |
| 2010/0133922 A1 | 6/2010 | Payack | |
| 2010/0301021 A1 * | 12/2010 | Bohori | B23K 9/013 219/121.48 |
| 2011/0141644 A1 | 6/2011 | Hastings et al. | |
| 2011/0234099 A1 | 9/2011 | Ganireddy et al. | |
| 2011/0248002 A1 * | 10/2011 | Bohori | H05H 1/52 219/121.5 |
| 2011/0315662 A1 | 12/2011 | Byron et al. | |
| 2012/0067854 A1 * | 3/2012 | Cutler | H01T 2/02 219/121.48 |
| 2012/0068602 A1 * | 3/2012 | Roscoe | H01T 2/02 315/111.21 |
| 2012/0181253 A1 * | 7/2012 | Asokan | H01H 9/542 218/16 |
| 2013/0120879 A1 * | 5/2013 | Shea | H01T 2/02 361/13 |
| 2013/0194702 A1 * | 8/2013 | Asokan | H01F 38/00 361/13 |
| 2013/0329325 A1 * | 12/2013 | Ganireddy | H01T 2/02 361/56 |
| 2014/0239812 A1 * | 8/2014 | Valdes | H05H 1/52 315/111.21 |

FOREIGN PATENT DOCUMENTS

| | | |
|---|---|---|
| CN | 202678928 U | 1/2013 |
| EP | 2109205 A1 | 10/2009 |
| EP | 2432087 A2 | 3/2012 |

OTHER PUBLICATIONS

Roscoe et al., "Arc-Flash Energy Mitigation by Fast Energy Capture", Industry Applications Society Annual Meeting, pp. 1-9, Oct. 2009.

US Non Final Office Action issued in connection with related U.S. Appl. No. 13/752,671 on Jul. 18, 2014.

Unofficial English translation of Office Action issued in connection with corresponding CN Application No. 201410059388.2 on Mar. 21, 2017.

\* cited by examiner

SYSTEM AND APPARATUS FOR ARC ELIMINATION

BACKGROUND

Embodiments of the invention relate generally to an arc elimination system and, more particularly, to plasma guns used in the arc elimination system.

Electrical circuits and switchgears have conductors separated by a dielectric material or gap of insulation such as air or gas. If the insulation between conductors or any other live parts such as an electrode, a metallic support or assembly connected to the conductor or the electrode is compromised, or voltage exceeds the insulation properties, an arc may occur between such conductors or live parts. The insulation between the live parts may become ionized, which makes the insulation conductive and enables formation of an arc flash.

Existing fuses and circuit breakers alone may not react fast enough to an arc flash to avoid any damage to personnel or equipment. An electric arc device such as an arc elimination system is used to short an electrical circuit and thus divert the electrical energy away from the accidental arc flash. The short circuit thus created is then cleared by tripping a fuse or circuit breaker. Electric arc devices are used in a variety of applications, including series capacitor protection, high power switches, acoustic generators, shock wave generators, and pulsed plasma thrusters, apart from the arc elimination systems. Such devices may include two or more main electrodes separated by a gap of air or gas.

Some known electric arc devices position main electrodes close to each other to provide an effective spread of ablative plasma from a plasma gun to the main electrodes due to shorter distance for the ablative plasma to spread from the plasma gun to the main electrodes. For medium voltage power systems, the distance or clearance between the main electrodes of the electric arc device may be reduced to, for example, about 50 to 75 millimeters (mm) from the recommended clearance of 150 mm. However, reducing the clearance between the main electrodes of the electric arc device too much may result in unwanted operation under system overvoltage conditions. Some existing electric arc devices implement a protection device such as a surge arrester to handle the overvoltage challenge associated with shorter clearance, and thus achieve the basic insulation level (BIL) as per the required standards. However, due to shorter clearance, contaminants or even the natural impedance of the air in the gap may result in undesirable arc formation between the main electrodes, which can lead to an unwanted operation of the electric arc device and also induce an undesired operation such as false tripping of a circuit breaker or fuse.

Therefore, some existing electric arc devices increase the clearance between the main electrodes to avoid such false tripping. However, these devices are typically less reliable due to the challenge posed by the longer clearances where the spreading of the ablative plasma may not be sufficient to reach all the main electrodes since the main electrodes are positioned at a greater distance apart from each other and also from the plasma gun.

Thus, there is a need to provide an arc elimination system and associated apparatuses that overcome some of the limitations described above.

BRIEF DESCRIPTION

In accordance with one embodiment, an apparatus is provided. The apparatus includes a plasma generation element physically coupled to a first main electrode. The plasma generation element includes at least a first open end and a second open end. Each open end defines a nozzle such that the first open end directs an ablative plasma to a second main electrode and the second open end directs the ablative plasma to a third main electrode.

In accordance with another embodiment, an arc elimination system is provided. The arc elimination system includes a plurality of main electrodes including a first main electrode, a second main electrode, and a third main electrode. The arc elimination system further includes an apparatus including a plasma generation element physically coupled to the first main electrode. The plasma generation element includes at least a first open end and a second open end, wherein each open end defines a nozzle such that the first open end directs an ablative plasma to the second main electrode and the second open end directs the ablative plasma to the third main electrode.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of terms such as "including," "comprising," or "having" and variations thereof herein are meant to encompass the items listed thereafter and equivalents thereof as well as additional items. The terms "top," "bottom," "side," "middle," "outer," "inner" and "above" as used herein are meant to reflect relative, as opposed to absolute positions.

Also, the term "substantial" or "substantially" as used herein is a qualifier term to indicate that the characteristic is present but some deviation is allowed. The amount of allowable deviation may vary depending on the particular context. For example, "disposed substantially" indicates that either a major portion of, or the entire element is disposed within another element. The term "substantially equidistant" indicates that an element 'X' is close to being exactly equidistant from two other elements 'Y' and 'Z', but small deviations are included, for example, the distance between elements 'X' and 'Y' may be less or greater by up to ten percent of the distance between elements 'X' and 'Z.' Approximating language, as used herein, may be applied to modify any quantitative representation that may permissibly vary without resulting in a change in the basic function to which it is related. Accordingly, a value modified by a term such as "about" is not to be limited to the precise value specified.

Various embodiments of the present invention describe an arc elimination system and associated apparatuses that allow the main electrodes to be placed at longer clearances to meet the required standards for basic insulation level (BIL) while providing effective arc elimination. Also, such systems and apparatuses are reliable and scalable to longer and shorter clearances between the main electrodes required as per different voltage levels in an electric power system.

Figure 1:
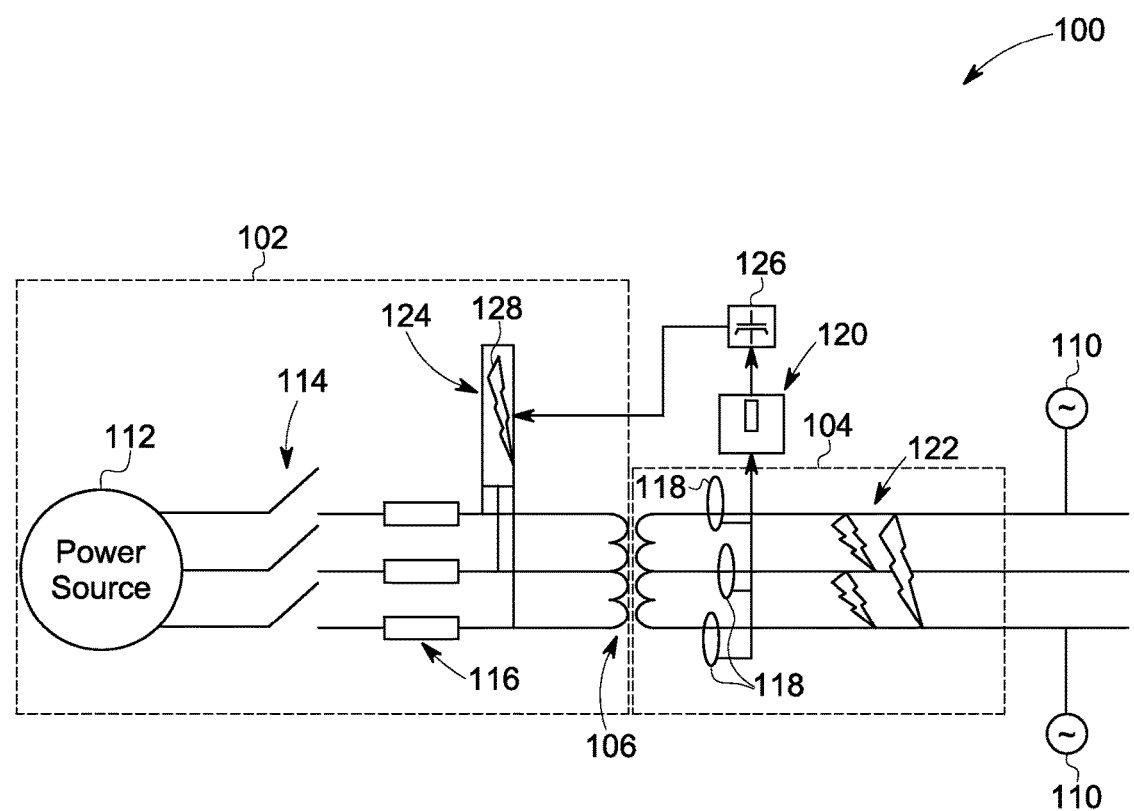
FIG. 1 is a block diagram of components in an electric power system in accordance with one embodiment.

One example of an electric power system in which such arc elimination systems and apparatuses are used is depicted in FIG. 1.

FIG. 1 is a block diagram of components in an electric power system 100 (hereinafter referred to as "system 100"), in accordance with one embodiment. While FIG. 1 generally depicts a three-phase connection, the depicted system 100 may be equally applied to single-phase and two-phase electric power systems. As shown in FIG. 1, the system 100 may include a primary side 102 and a secondary side 104 of a transformer 106. In one embodiment, the transformer 106 may connect a medium voltage (MV) line such as a power source 112 (for example, operating at 17.5 kilo-Volts (kV), 13.8 kV, 11 kV or 5 kV line) on the primary side 102 and one or more loads 110 (for example, at 240V, 480V, 600V, 2.3 kV, 4.16 kV, 6.6 kV or 11 kV line) on the secondary side 104. In various embodiments, the voltage at the primary side 102 may be greater than or equal to the voltage at the secondary side 104.

In some embodiments, the primary side 102 may include a switch assembly 114 and a fuse 116 electrically coupled to the power source 112, and the secondary side 104 may include one or more sensors 118. The sensors 118 may be configured to generate signals in response to light, current, voltage, pressure, noise, or any combination thereof, and may be further configured to transmit these signals to a controller 120 for further processing. In one embodiment, the controller 120 may be configured to determine if an electrical arc 122 is present on the secondary side 104 of the transformer 106. In various embodiments, the controller 120 may be one of several types of controlling devices, for example, an arc flash relay, or any suitable over-current trip or relay.

Once the controller 120 determines that the electrical arc 122 is present on the secondary side 104 of the transformer 106, the controller 120 may send a signal to an arc elimination device or system 124 to create an electrical short on the primary side 102 of the transformer 106. In one embodiment, the controller 120 may include a trigger circuit (not shown in FIG. 1) configured to generate an electrical pulse for triggering a plasma generation element (not shown in FIG. 1) in the arc elimination system 124 to generate the short between main electrodes (not shown) in the arc elimination system 124. As shown in FIG. 1, in some embodiments, the controller 120 may communicate with a trigger circuit assembly that includes capacitors 126 for energy storage. The capacitors 126 provide the energy to trigger plasma within the arc elimination system 124, capable of causing a controlled arc 128 to be created between the transformer 106 and the fuse 116. In one embodiment, the short created between the main electrodes by the arc elimination system 124 may result in creation of the controlled arc 128 within the arc elimination system 124. The controlled arc 128 may cause the electrical arc 122 on the secondary side 104 of the transformer 106 to be eliminated quickly due to power being diverted to the created controlled arc 128 on the primary side 102 of the transformer 106.

Furthermore, the short created by the arc elimination system 124 may accelerate triggering of the switch assembly 114 or the fuse 116 on the primary side 102 of the transformer 106, for example, by blowing the fuse 116 more quickly than it would have blown by the electrical arc 122 on the secondary side 104 of the transformer 106.

Various alternate embodiments such as the use of a circuit breaker instead of the fuse 116 and various other advantages of the system 100 are disclosed in the commonly assigned U.S. patent application Ser. No. 13/752,671 (corresponding Indian Patent Application No. 362/CHE/2012), which is herein incorporated by reference in its entirety.

Figure 2:
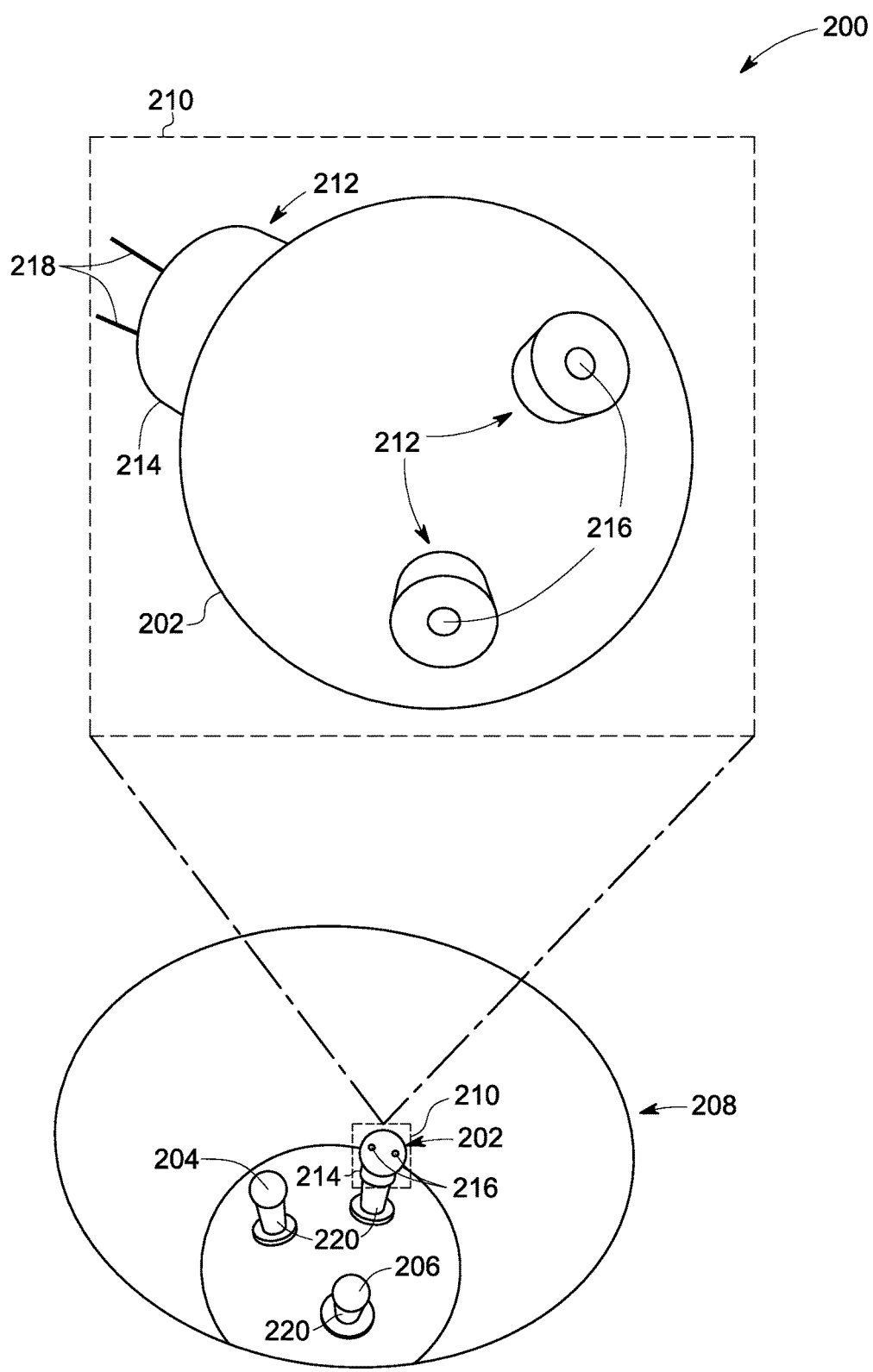
FIG. 2 is a schematic representation of an arc elimination system used in the electric power system, in accordance with one embodiment.

FIG. 2 is a schematic representation of the arc elimination system 124 (hereinafter referred to as "system 124") used in the electric power system 100, in accordance with one embodiment. The system 124 may include a plurality of main electrodes. In an exemplary embodiment as shown in FIG. 2, three main electrodes, that is, first main electrode 202, second main electrode 204 and third main electrode 206 are shown as being disposed in a housing 208. In some embodiments, some or all of the main electrodes 202, 204, and 206 may be hollow metallic conducting elements. While FIG. 2 depicts three main electrodes, other embodiments may include a greater or fewer number of electrodes. In some embodiments, each of the main electrodes may be connected to an electrically different portion of an electric circuit (not shown in FIG. 2), for example, different phases, neutral, or ground. Any one of the first, second and third main electrodes 202, 204, and 206 may be physically coupled to a plasma generation element 212 of an apparatus 210, where the plasma generation element 212 may be configured to generate ablative plasma. The plasma generation element 212 may be, for example, a plasma gun formed from an ablative material such as Polytetrafluoroethylene, Polyoxymethylene Polyamide, Poly-methyle methacralate (PMMA), other ablative polymers, or various mixtures of these materials. Although any one of the main electrodes 202, 204, and 206 may be physically coupled to the plasma generation element 212, to avoid confusion, only a coupling between the first main electrode 202 and the plasma generation element 212 is described in detail. The plasma generation element 212 may nonetheless be coupled to a different main electrode in a similar manner.

Figure 5:
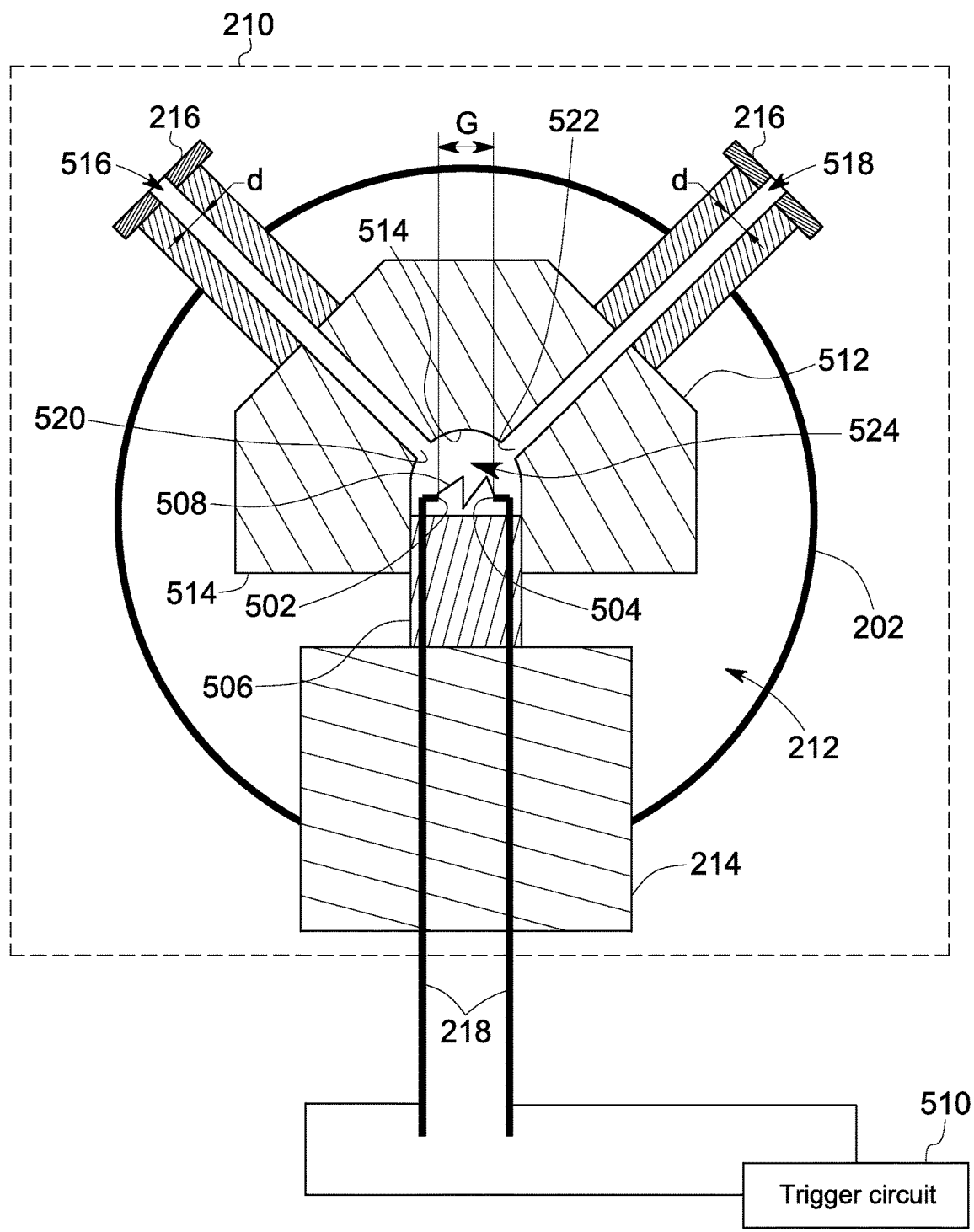
FIG. 5 is a sectional view of an apparatus including a plasma generation element disposed substantially within the first main electrode, in accordance with one embodiment.
Figure 6:
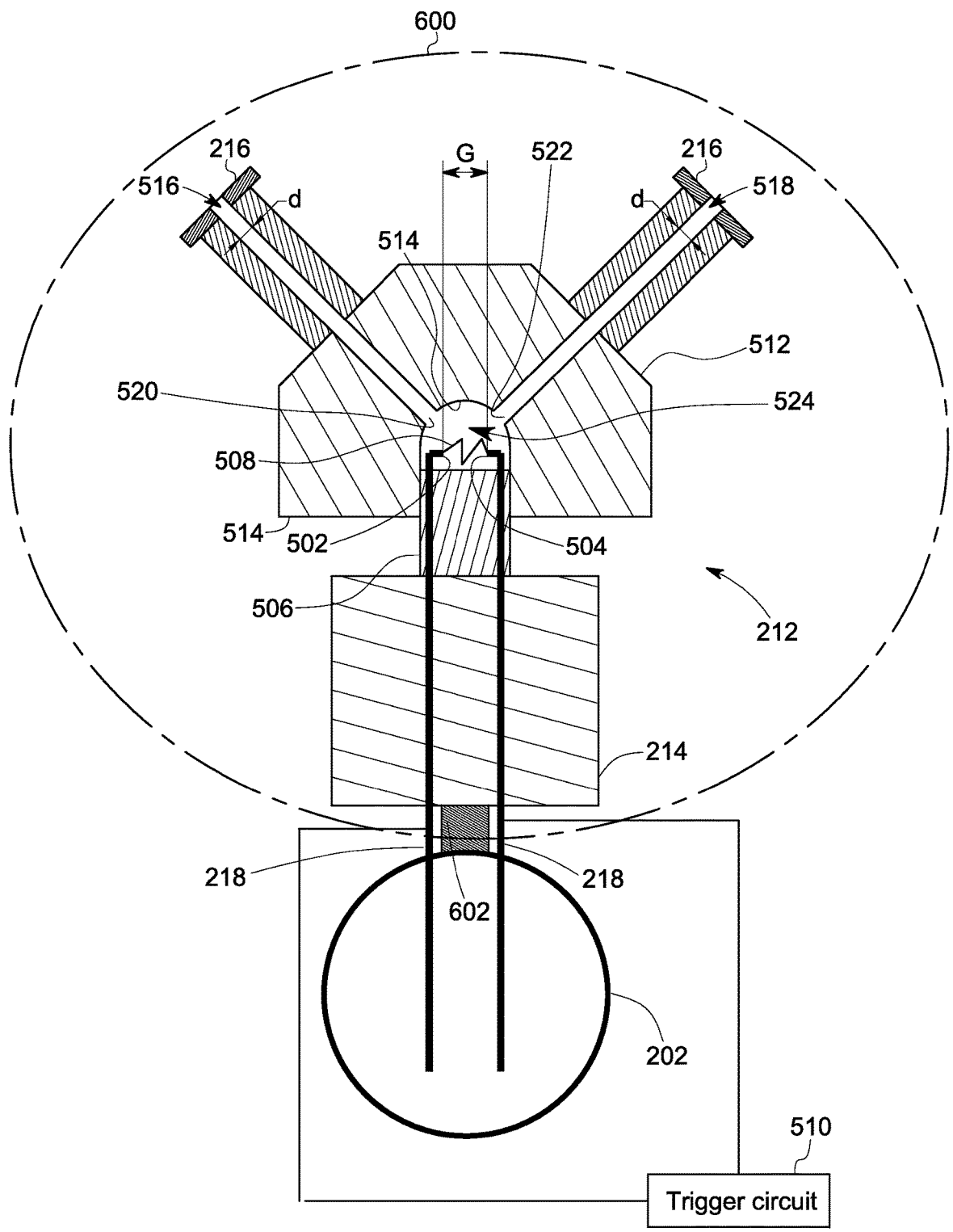
FIG. 6 is a sectional view of an apparatus including the plasma generation element disposed on the first main electrode, in accordance with another embodiment.

FIG. 2 further depicts an enlarged view of the apparatus 210 including the plasma generation element 212, which is physically coupled to the first main electrode 202 in accordance with one embodiment. The plasma generation element 212 may include a first portion 214, nozzles 216, and first and second gun electrodes 218. In an embodiment as shown in FIG. 5, the physical coupling may be achieved by disposing the plasma generation element 212 substantially within the first main electrode 202 with only some portions protruding out. In such an embodiment, as shown in the enlarged view of the apparatus 210 and in detail in FIG. 5, the portions of the plasma generation element 212 protruding out of the first main electrode 202 may include a part of the first portion 214, a portion of the nozzles 216, and some portions of the first and second gun electrodes 218. In an alternative embodiment as shown in FIG. 6, the physical coupling may be achieved by disposing the plasma generation element 212 on the first main electrode 202.

The plasma generation element 212 and the first main electrode 202 may be physically coupled to each other using any known fastening means, such as, but not limited to, a weld, braze, adhesive, fastener, or any combination thereof.

In an alternative embodiment (not shown), the first portion 214, the first and second gun electrodes 218, or the first portion 214 and the gun electrodes 218 may be disposed entirely within the first main electrode 202. The detailed view of the plasma generation element 212 and its physical coupling with the first main electrode 202 are described later in conjunction with FIGS. 5 and 6.

Figure 3:
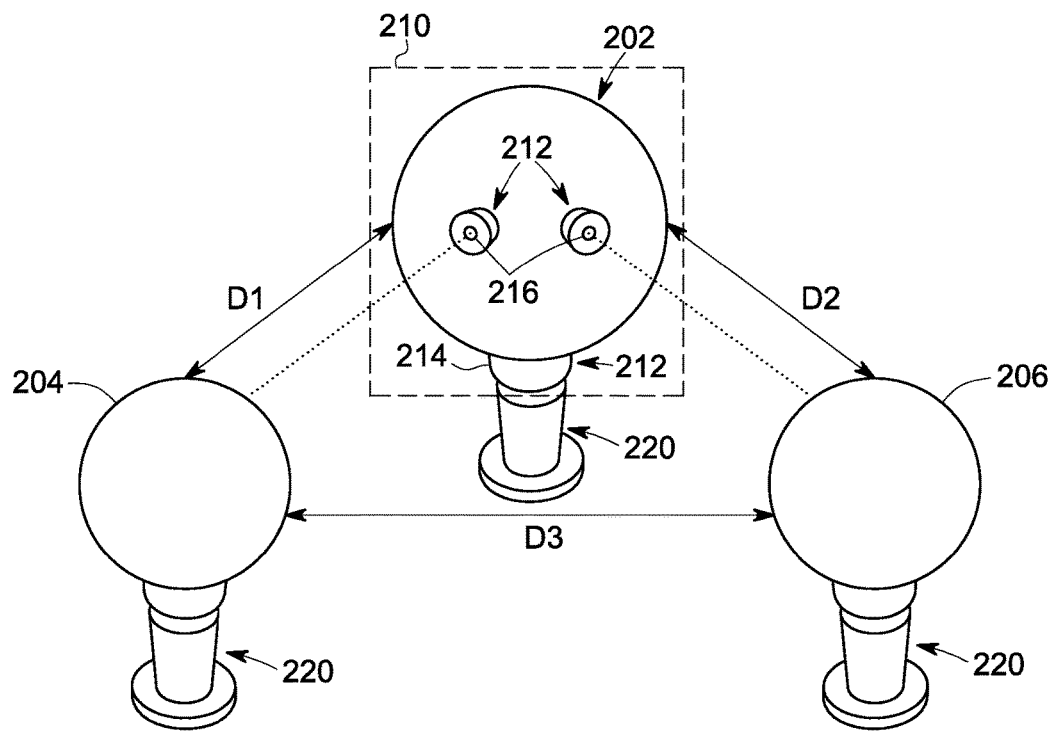
FIG. 3 depicts a triangular arrangement of first, second and third main electrodes within the arc elimination system, in accordance with one embodiment.
Figure 4:
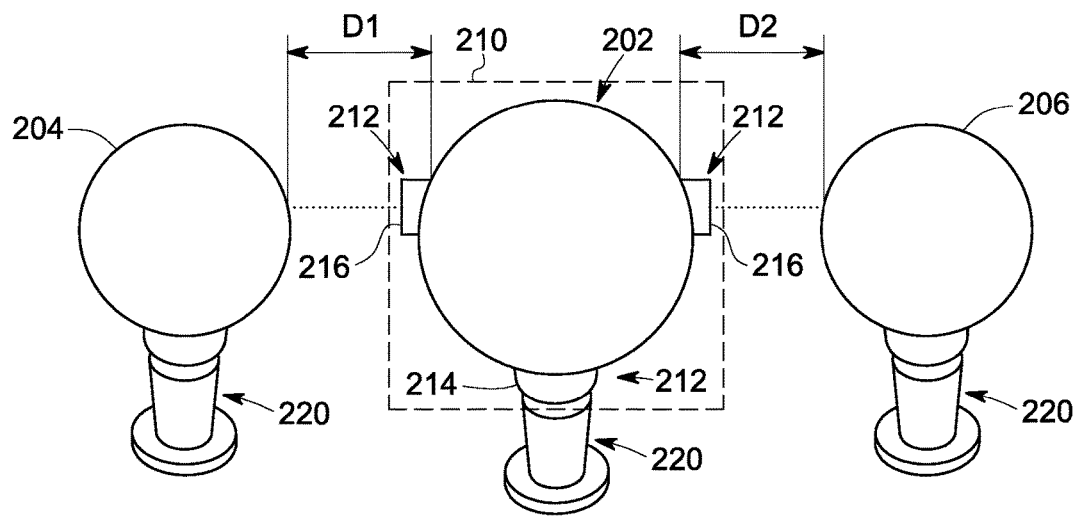
FIG. 4 depicts a linear arrangement of the first, second and third main electrodes within the arc elimination system, in accordance with another embodiment.

Further, as shown in FIGS. 2-4, the main electrodes 202, 204, and 206 may be disposed on respective base elements 220 that may act as mechanical supports. In an embodiment, as shown in FIG. 2 where the apparatus 210 may include some portions of the plasma generation element 212 protruding out of the first main electrode 202, some portion of the apparatus 210 (for example, the first portion 214 of the plasma generation element 212) may be disposed on one of the base elements 220. In an alternative embodiment (not shown) where the apparatus 210 or the plasma generation element 212 is disposed entirely within the first main electrode 202 (that is, with no portion protruding out of the first main electrode 202), the first main electrode 202 (instead of some portion of the apparatus 210) may be disposed on one of the base elements 220.

Clearance between the main electrodes 202, 204, and 206 may need to be maintained for normal operation of the electrical power system 100 based on the operating voltage of the system 100 in order to meet the BIL requirements. For example, the clearance between each of the main electrodes 202, 204, and 206 may be about 25 to 30 millimeters (mm) for a low voltage system operating at about 600 Volts (V), and about 50 to 200 mm for a medium voltage system operating at about 12-38 kV. The physical coupling of the plasma generation element 212 with the first main electrode 202 may allow the main electrodes 202, 204, and 206 to be separated by longer clearances to meet the required standards for BIL. Such BIL standards may be achieved by overcoming reliability challenges posed by the longer clearances in the existing solutions where the spreading of the ablative plasma may not be sufficient to reach all the main electrodes since the main electrodes are positioned further apart from each other and also from the plasma gun. In accordance with various embodiments described herein, the design of the plasma generation element 212 may be modified with respect to the existing designs of the plasma guns, and such a modified plasma generation element may be physically coupled to the first main electrode 202. Furthermore, in such embodiments, the first main electrode 202 may be arranged with respect to the other two main electrodes 204 and 206 in such a way so as to overcome the reliability challenges posed by the existing solutions. Such embodiments are described in detail below in conjunction with FIGS. 3-6.

FIG. 3 depicts a triangular arrangement of the main electrodes 202, 204, and 206 within the system 124 (not shown in FIG. 3), in accordance with one embodiment. The main electrodes 202, 204, and 206 may be separated from each other such that a required clearance is maintained based on the system operating voltage. In some embodiments, the nozzles 216 of the plasma generation element 212 may be physically coupled with the first main electrode 202 such that the plasma generated by the plasma generation element 212 may be directed to the second and third main electrodes 204 and 206 through the nozzles 216. In one embodiment, the plasma generation element 212 may be substantially disposed within the first main electrode 202 such that one of the nozzles 216 is oriented to direct the ablative plasma to the second main electrode 204 and the other nozzle is oriented to direct the ablative plasma to the third main electrode 206. In one exemplary embodiment, the nozzles 216 may be configured to direct the ablative plasma to the second and third main electrodes 204 and 206 simultaneously. The directed ablative plasma may create a conductive plasma bridge between the second and third main electrodes 204 and 206. The combination of orientation of the nozzles 216 directly towards the respective second and third main electrodes 204 and 206, and the physical coupling of the plasma generation element 212 to the first main electrode 202 may result in efficiently bridging a dielectric insulting gap between the second and third main electrodes 204 and 206. The bridging may result in shorting the main electrodes 202, 204, and 206 and allowing the controlled arc 128 to form therebetween. The shorting may act to mitigate the electrical arc 122 on the secondary side 104 by triggering the switch assembly 114 or the fuse 116 on the primary side 102 of the transformer 106.

Various embodiments described herein consider three main electrodes; however, in an alternative embodiment where more than three main electrodes are present, the number of nozzles may be increased such that one nozzle each may be oriented towards respective main electrode.

In one embodiment, the main electrodes 202, 204, and 206 may be substantially equidistant from each other. In one exemplary embodiment, the main electrodes 202, 204 and 206 may be separated from each other by a distance of about 50 to 200 mm. As shown in FIG. 3, distance 'D1' between the first and second main electrodes 202 and 204 may be substantially equal to distance 'D2' between the first and third main electrodes 202 and 206, and further substantially equal to distance 'D3' between the second and third main electrodes 204 and 206. In some embodiments, where the plasma generation element 212 is physically coupled to the first main electrode 202, the distance between the second main electrode 204 and one of the nozzles 216 (oriented toward the second main electrode 204) may be same as the distance between the third main electrode 206 and the other nozzle (oriented toward the third main electrode 206).

In some embodiments, the plasma generation element 212 may be configured such that when the clearance between the main electrodes 202, 204, and 206 is increased, the distance over which the plasma generation element 212 directs the ablative plasma to the second and third main electrodes 204 and 206 is increased. Similarly, in some other embodiments, the plasma generation element 212 may be configured such that, when the clearance between the main electrodes 202, 204, and 206 is reduced, the distance over which the plasma generation element 212 directs the ablative plasma to the second and third main electrodes 204 and 206 is decreased. Thus, various embodiments provide an arc elimination system and apparatus that are scalable to longer and shorter clearances between the main electrodes 202, 204, and 206 based on the operating voltage of the system 100.

In various embodiments, the main electrodes 202, 204, and 206 may be arranged in a configuration other than the triangular arrangement depicted in FIG. 3, such that at least the second and third main electrodes 204 and 206 still remain substantially equidistant from the first main electrode 202. FIG. 4 depicts a linear arrangement of the main electrodes 202, 204, and 206 within the system 124 (not shown in FIG. 4), in accordance with another embodiment. As shown in FIG. 4, distance 'D1' between the first and second main electrodes 202 and 204 may be substantially equal to the distance 'D2' between the first and third main electrodes 202 and 206. In one exemplary embodiment, the distance 'D1' may be about 50 to 200 mm. Since the arrangement shown in FIG. 4 is linear as compared to the triangular arrangement shown in FIG. 3, the nozzles 216 in FIG. 4 are oriented such that the nozzles 216 direct the ablative plasma in substantially opposite directions toward the respective second and third main electrodes 204 and 206.

FIG. 5 is a sectional view of the apparatus 210 including the plasma generation element 212 disposed substantially within the first main electrode 202, in accordance with one embodiment. As depicted in FIG. 5, the first and second gun electrodes 218 may include a first end 502 and a second end 504, respectively. The gun electrodes 218 may be inserted in a cavity (not shown) defined via the first portion 214 and a second portion 506 of the plasma generation element 212. In one embodiment, the first and second portions 214 and 506 may be physically coupled to each other via any known fastening means as described above. As shown in FIG. 5, the first and second ends 502 and 504 may extend into the plasma generation element 212 and define a gap 'G' therebetween for formation of an arc 508. In an exemplary embodiment, the gap 'G' between the first and second ends 502 and 504 may be about 0.1 to 2 mm. As shown in FIG. 5, the first and second ends 502 and 504 of the gun electrodes 218 may be disposed above and in close proximity to the second portion 506 of the plasma generation element 212. Alternatively, in another embodiment (not shown), a cavity may be defined in at least a portion of the top surface of the second portion 506 such that the first and second ends 502 and 504 of the gun electrodes 218 may be positioned in that cavity.

Additionally, the first and second gun electrodes 218 may be communicatively coupled to a trigger circuit 510. As described above, in one embodiment, the trigger circuit 510 may be included in the controller 120 (shown in FIG. 1). Alternatively, in another embodiment, the trigger circuit 510 may be separate from the controller 120 and disposed in proximity to the first and second gun electrodes 218. The trigger circuit 510, such as a pulse generator, may be configured to transmit an electrical pulse to the plasma generation element 212, thus generating an ablative plasma in the gap 'G.' The ablative plasma may result in the formation of the arc 508 in the gap 'G.'

As depicted in FIG. 5, the plasma generation element 212 may further include a third portion 512 that may be removably coupled to the second portion 506 at one end and to the nozzles 216 at the other end. The second and third portions 506 and 512 of the plasma generation element 212 may be physically coupled to each other and the nozzles 216 and the third portion 512 of the plasma generation element 212 may be physically coupled to each other via any known fastening means. In one embodiment as shown in FIG. 5, a cavity may be defined at a bottom end 514 of the third portion 512 of the plasma generation element 212 such that the first and second ends 502 and 504 of the gun electrodes 218 and at least a portion of the second portion 506 of the plasma generation element 212 may extend into that cavity.

Furthermore, as shown in FIG. 5, a first through hole 516 may be formed via one side of the third portion 512 that may further extend through one of the nozzles 216, and a second through hole 518 may be formed via another side of the third portion 512 that may further extend through the other nozzle. One end of the first through hole 516 and one end of the second through hole 518, which extend into the third portion 512, are herein referred to as a first open end 520 and a second open end 522, respectively. Each open end may define a nozzle such that the first open end 520 may direct the ablative plasma to the second main electrode 204, and the second open end 522 may direct the ablative plasma to the third main electrode 206 (as shown in FIGS. 2 and 3). In an exemplary embodiment, the first open end 520 or the second open end 522 or both may have a diameter 'd' of about 0.2 to 5 mm. The diameters of the first and second open ends 520 and 522 may be same or different, in accordance with one embodiment.

In various embodiments, the ablative plasma may be generated in a region 524 defined between the first and second open ends 520 and 522, and the first and second ends 502 and 504 of the first and second gun electrodes 218. Such embodiments consider that a space or region (not shown) between the first and second ends 502 and 504 and the top surface of the second portion 506 may be small enough to be neglected for defining the region 524. However, in some other embodiments where the space or region between the first and second ends 502 and 504 and the top surface of the second portion 506 is to be considered, the region 524 may be defined between the first and second open ends 520 and 522 and the top surface of the second portion 506. Irrespectively, the region 524 may be substantially closed by the solid portions such as the second portion 506 at the bottom of the region 524 and the third portion 512 at the top and sides of the region 524. The term "substantially closed" herein indicates that either a major portion of the region 524 defines an enclosure or the entire region 524 is closed, that is, without any openings. FIG. 5 considers the embodiment where although the major portion of the region 524 is closed, the region 524 may have two openings, that is, the first and second open ends 520 and 522. Although the shape of the region 524 depicted in FIG. 5 is semi-circle, the region 524 may be of any other shape, for example, rectangular, triangular or so on, without deviating from the scope of the invention.

Alternatively, in another embodiment (not shown), the first and second open ends 520 and 522 may be configured to close or open based on a trigger from a pressure sensor deployed within or in proximity to the region 524. Such a pressure sensor may be configured to sense the pressure of the region 524, such that while low pressure is being detected the first and second open ends 520 and 522 may be kept closed, and upon detection of a high pressure, which may be pre-defined, the pressure sensor may trigger the first and second open ends 520 and 522 to open in order to allow the ablative plasma to pass through the nozzles 216 and thereby reach the respective second and third main electrodes 204 and 206. In an exemplary embodiment, the ablative plasma may be generated at a pressure of about 100,000 to 5,000,000 pascals within the region 524. In such an embodiment, for example, the first and second open ends 520 and 522 may be configured to be kept closed when the pressure is at or below 100,000 pascals and may be configured to open when the pressure exceeds 100,000 pascals.

In some embodiments, the volume of the region 524 may be kept low to generate high pressure ablative plasma within the region 524. In an exemplary embodiment, the volume of the region 524 may be about 0.5 to 5 cubic centimeters. The high pressure ablative plasma may facilitate formation of a conductive plasma bridge between the second and third main electrodes 204 and 206 since the higher pressure may allow the ablative plasma to reach the second and third main electrodes 204 and 206 that are positioned at longer distances or clearances (for example, about 100 to 200 mm) from the first main electrode 202. Moreover, the diameters of the first and second open ends 520 and 522 may be kept small (for example, 0.2 to 5 mm as described above) and the open ends 520 and 522 may be oriented towards the respective second and third main electrodes 204 and 206 in order to allow the substantial amount of ablative plasma to reach the second and third main electrodes 204 and 206 at high pressure. The substantial amount of high-pressure ablative plasma reaching the second and third main electrodes 204 and 206 may thus result in efficiently bridging the dielectric insulting gap between the second and third main electrodes 204 and 206.

Further, in some embodiments, the first main electrode 202, in which the plasma generation element 212 is substantially disposed, may have multiple holes formed at various portions of the first main electrode 202 to allow some portions of the plasma generation element 212 to protrude out of the first main electrode 202. In an exemplary embodiment, in order to emit ablative plasma to the other two main electrodes 204 and 206, two through holes (not shown) may be formed in the first main electrode 202 for the nozzles 216 to allow some portion of the nozzles 216 to protrude out of the first main electrode 202. Similarly, in another exemplary embodiment, another through hole (not shown) may be formed in the first main electrode 202 to allow some part of the first portion 214 to protrude out of the first main electrode 202.

FIG. 5 considers the embodiment where the plasma generation element 212 is disposed substantially within the first main electrode 202. However, as described earlier, the plasma generation element 212 may alternatively be disposed on the first main electrode 202. FIG. 6 is a sectional view of an apparatus 600 including the plasma generation element 212 disposed on the first main electrode 202, in accordance with another embodiment. The apparatus 600 may include all components of the apparatus 210 except that the apparatus 600 may have the plasma generation element 212 being disposed on the first main electrode 202, instead of being disposed substantially within the first main electrode 202 as shown in the apparatus 210. In some embodiments as shown in FIG. 6, a connecting element 602 may be disposed on the first main electrode 202 such that the plasma generation element 212 may be positioned on this connecting element 602. The connecting element 602 may include a planar top surface configured to provide the required support to the apparatus 600 so that the apparatus 600 may be fixedly (and physically) coupled to one end of the connecting element 602, whereas other end of the connecting element 602 may be physically coupled to the first main electrode 202. In an alternative embodiment, the plasma generation element 212 may be directly coupled to the first main electrode 202 using any known fastening means, such as an adhesive, without using the connecting element 602. Various embodiments described above in conjunction with FIG. 5 may be equally applied to the apparatus 600 and the trigger circuit 510 that may be communicatively coupled to the first and second gun electrodes 218.

Figure 7:
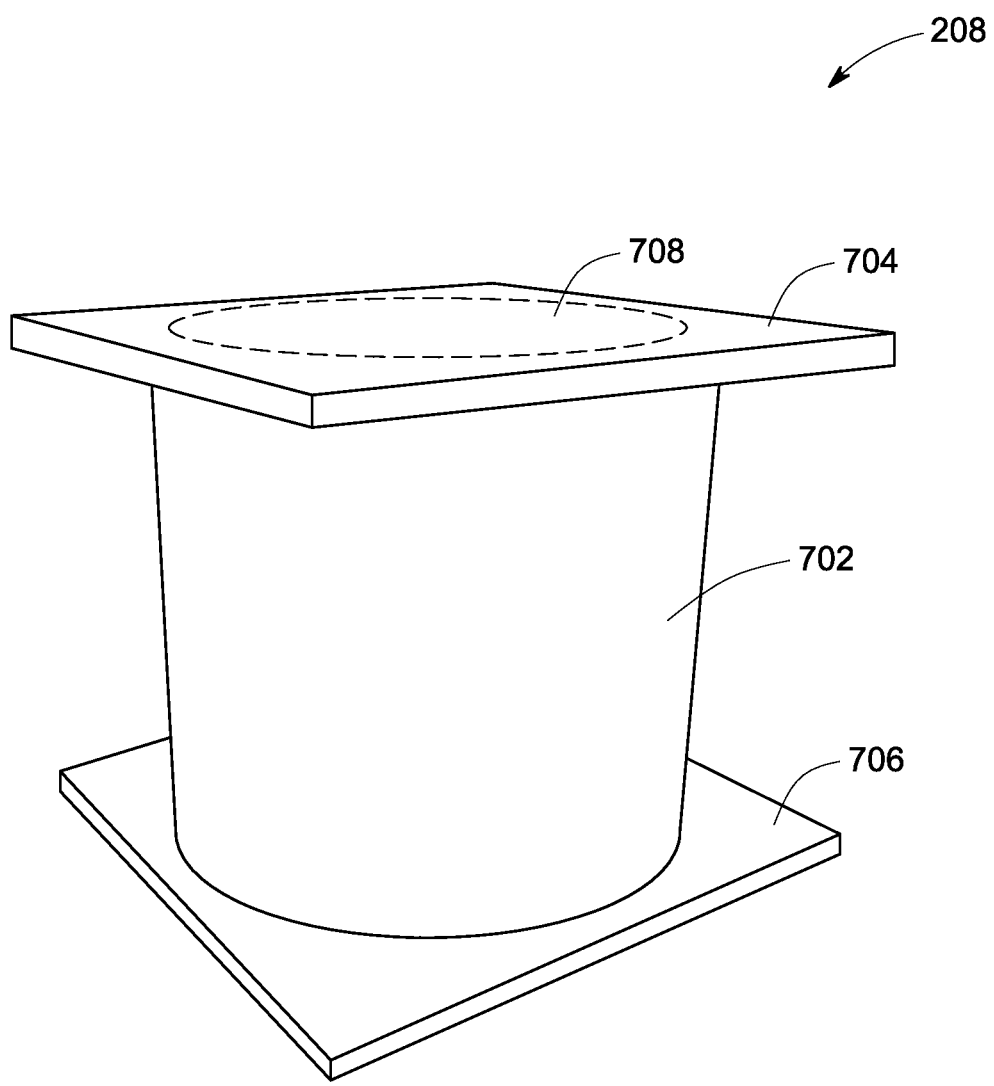
FIG. 7 is a housing in which the first, second and third main electrodes are disposed, in accordance with one embodiment.

As described above, the main electrodes 202, 204, and 206 may be disposed in the housing 208. The housing 208 may be of any size, shape, or configuration capable of accepting these electrodes therein. One such exemplary embodiment of the housing is depicted in FIG. 7. As shown in FIG. 7, the housing 208 may include a cylindrical portion 702 with the two ends (not shown) of the cylindrical portion 702 being joined to two portions 704 and 706, respectively. The number of joints or physical coupling in the housing 208 may be minimal, in accordance with one embodiment. For example, in FIG. 7, the only joints in the housing 208 may be between the cylindrical portion 702 and the two portions 704 and 706. In some embodiments, the joints may be made stronger by using, for example, epoxy resin and threading.

The portion 704 may be provided with a circular (shown in FIG. 7) or any other shaped cavity 708 such that the main electrodes 202, 204, and 206 (not shown in FIG. 7) may be disposed within this cavity 708. The inner view of the housing 208 is visible in FIG. 2 where the three main electrodes 202, 204, and 206 are shown. In an exemplary embodiment, the housing 208 may be a dielectric enclosure or a metallic enclosure. In another exemplary embodiment, the housing 208 may be made of a composite material, for example, a fiberglass reinforced plastic (FRP). The stronger and less number of joints in combination with the use of FRP material provide a compact housing design that is robust enough to withstand the shock waves and high pressures resulting from arc events within the housing 208. A known shock shield (now shown) may also be provided in the housing 208 to further reduce shock waves and high pressure.

Various embodiments of the present invention describe arc elimination system (such as 124) and associated apparatus (such as 210 or 600) that may allow the main electrodes (such as 202, 204, and 206) to be placed at longer clearances to meet the required standards for BIL while providing effective arc elimination. The physical coupling of the plasma generation element (such as 212) with the first main electrode (such as 202) and the orientation of nozzles (such as 216) towards the other two main electrodes may allow the main electrodes to be separated by longer clearances to meet the required standards for BIL. The physical coupling and the orientation of nozzles may further overcome the reliability challenge posed by the longer clearances in the existing solutions where the spreading of the ablative plasma may not be sufficient to reach all the main electrodes since the main electrodes are positioned distance apart from each other and also from the plasma gun (such as 212).

Also, systems and apparatuses may be reliable and scalable to longer and shorter clearances between the main electrodes required as per different operating voltages in an electric power system. The same arrangement and configuration may be used for different system operating voltages with modifications required only in clearances between the main electrodes, and power fed to the generated ablative plasma, in order to meet the BIL standards for that system operating voltage. Further, the systems and apparatuses eliminate the need for a protection device such as a surge arrester, which is generally used in the existing solutions to handle the overvoltage challenge associated with shorter clearance.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An apparatus comprising:
a plasma generation element physically coupled to a first main electrode, the plasma generation element comprising at least a first open end and a second open end, wherein each open end defines a nozzle such that the first open end directs an ablative plasma to a second main electrode and the second open end directs the ablative plasma to a third main electrode.

2. The apparatus of claim 1, wherein the first main electrode is hollow, and wherein at least a portion of the plasma generation element is disposed within the first main electrode.

3. The apparatus of claim 1, wherein the plasma generation element physically coupled to the first main electrode is disposed on the surface of the first main electrode.

4. The apparatus of claim 1, wherein the plasma generation element is configured to generate ablative plasma at a pressure of about 100,000 to 5,000,000 pascals.

5. The apparatus of claim 1, wherein the second and third main electrodes are separated from the first main electrode by a distance of about 50 to 200 millimeters (mm).

6. The apparatus of claim 1, wherein the second and third main electrodes are arranged substantially equidistant from the first main electrode.

7. The apparatus of claim 1, further comprising a plurality of gun electrodes comprising at least a first gun electrode and a second gun electrode, wherein the first gun electrode comprises a first end and the second gun electrode comprises a second end such that the first end and the second end extend into the plasma generation element and define a gap therebetween for formation of an arc.

8. The apparatus of claim 7, wherein the plasma generation element is configured to generate ablative plasma in a region defined between the first and second open ends and the first and second ends.

9. The apparatus of claim 8, wherein the volume of the region is about 0.5 to 5 cubic centimeters.

10. The apparatus of claim 7, wherein the gap between the first and second ends is about 0.1 to 2 mm.

11. The apparatus of claim 1, wherein at least one of the first open end or the second open end comprises a diameter of about 0.2 to 5 mm.

12. An arc elimination system comprising:
a plurality of main electrodes comprising a first main electrode, a second main electrode, and a third main electrode; and
an apparatus comprising:
a plasma generation element physically coupled to the first main electrode, the plasma generation element comprising at least a first open end and a second open end, wherein each open end defines a nozzle such that the first open end directs an ablative plasma to the second main electrode and the second open end directs the ablative plasma to the third main electrode.

13. The arc elimination system of claim 12, wherein the first main electrode is hollow, and wherein at least a portion of the plasma generation element is disposed within the first main electrode.

14. The arc elimination system of claim 12, wherein the plasma generation element is physically coupled to the first main electrode is disposed on the surface of the fist main electrode.

15. The arc elimination system of claim 12, further comprising a housing, wherein the plurality of main electrodes and the apparatus are disposed in the housing.

16. The arc elimination system of claim 12, further comprising a trigger circuit configured to generate an electrical pulse for triggering the plasma generation element.

17. The arc elimination system of claim 12, wherein the second and third main electrodes are separated from the first main electrode by a distance of about 50 to 200 millimeters (mm).

18. The arc elimination system of claim 12, wherein the apparatus further comprises a plurality of gun electrodes comprising at least a first gun electrode and a second gun electrode, wherein the first gun electrode comprises a first end and the second gun electrode comprises a second end such that the first end and the second end extend into the plasma generation element and define a gap therebetween for formation of an arc.

19. The arc elimination system of claim 18, wherein the plasma generation element is configured to generate ablative plasma in a region defined between the first and second open ends and the first and second ends.

20. The arc elimination system of claim 14, wherein at least one of the first open end or the second open end comprises a diameter of about 0.2 to 5 mm.

* * * * *